(12) United States Patent
Okada (10) Patent No.: US 6,858,871 B2
(45) Date of Patent: Feb. 22, 2005

(54) SEMICONDUCTOR DEVICE AND MANUFACTURING METHOD THEREFOR

(75) Inventor: Seigo Okada, Nara-ken (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/946,506

(22) Filed: Sep. 6, 2001

(65) Prior Publication Data

US 2002/0079499 A1 Jun. 27, 2002

(30) Foreign Application Priority Data

Dec. 25, 2000  (JP) ........................................ 2000-392750

(51) Int. Cl.$^7$ ............................ H01L 27/15; H01S 5/00
(52) U.S. Cl. ............................ 257/80; 257/81; 257/82; 257/99; 257/782; 372/50; 372/54; 385/14
(58) Field of Search ............................ 257/80–82, 99, 257/737, 738, 740, 782, 751, 772; 438/627, 643, 653, 602; 372/50, 54, 19; 385/14

(56) References Cited

U.S. PATENT DOCUMENTS 4,847,846 A  * 7/1989  Sone et al. ................... 372/50

* cited by examiner

Primary Examiner—Donghee Kang
(74) Attorney, Agent, or Firm—Nixon & Vanderhye, P.C.

(57) ABSTRACT

A red color laser diode 13 is die-bonded onto a silicon submount photodiode chip 11 having a insulating film 4 on the surface thereof. The silicon submount photodiode chip 11 receives a light beam radiated from a back side 13b of the red color laser diode 13 for monitoring an output of a light beam radiated from a front side 13a of the red color laser diode 13. The insulating film 4 of the silicon submount photodiode chip 11 is provided with a hole 14 located beneath an electrode 12 that die-bonds the red color laser diode 13 onto the silicon submount photodiode chip 11. Heat generated by the red color laser diode 13 is easily conducted to the silicon submount photodiode chip 11 through the hole 14 not covered with the insulating film 4 and discharged therefrom, which enables prevention of thermal destruction.

12 Claims, 10 Drawing Sheets

Fig.15 BACKGROUND ART ture of 80° C. or higher decreases efficiency of the optical output under high temperature conditions. As a result, an operating current of the red color laser diode 13 is increased, and continuous application of voltage to the red color laser diode 13 in such a condition may result in thermal destruction.

SEMICONDUCTOR DEVICE AND MANUFACTURING METHOD THEREFOR

BACKGROUND OF THE INVENTION

The present invention relates to a semiconductor device and a manufacturing method therefor.

Figure 13:
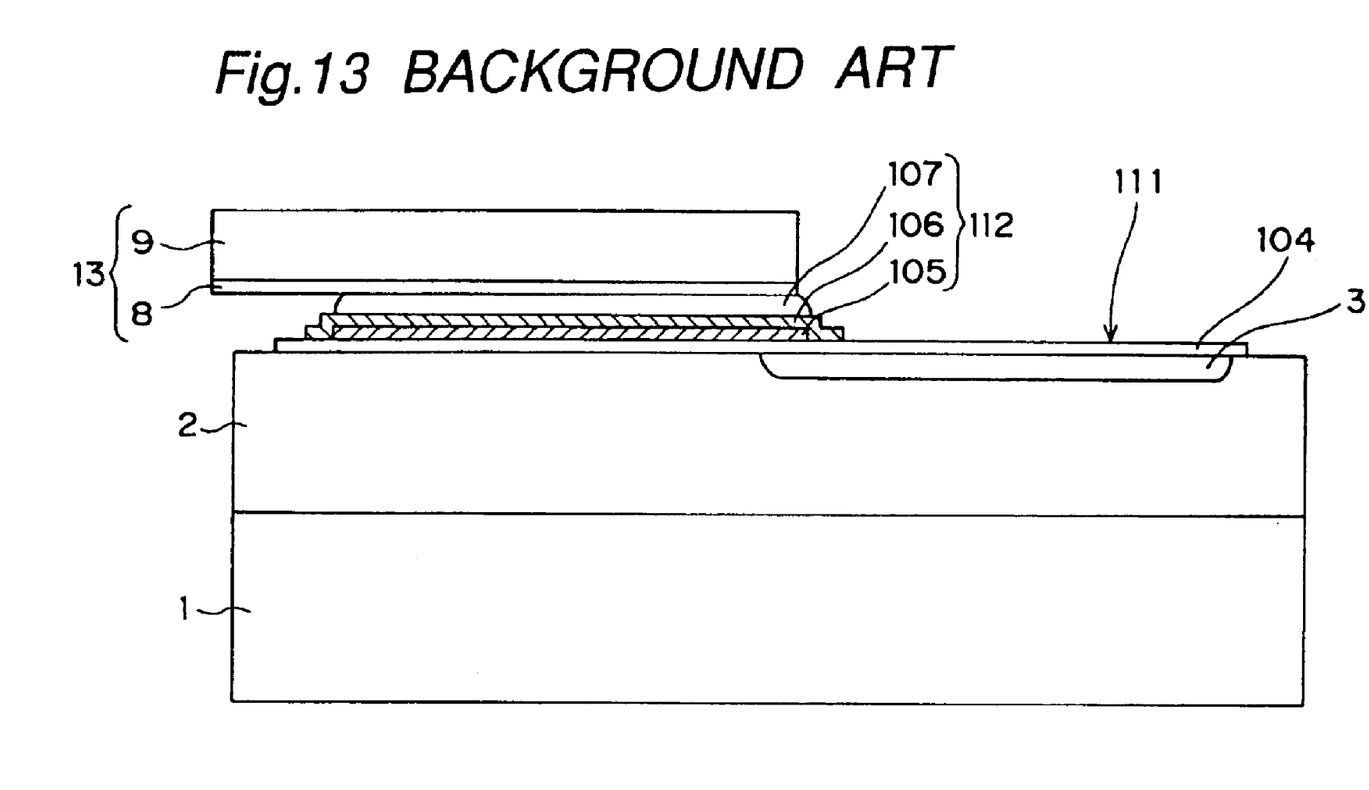
FIG. 13 a schematic cross sectional view showing the structure of a background art semiconductor device for DVD.

As a semiconductor device used for reading DVD (Digital Versatile Disc) and the same, there has been known a device, as shown in FIG. 13, composed of a silicon submount photodiode chip 111, and a red color laser diode 13 serving as a laser chip die-bonded onto the silicon submount photodiode chip 111.

The silicon submount photodiode chip 111 includes an N+-type silicon substrate 1, an N−-type silicon epitaxial layer 2 on the N+-type silicon substrate 1, a P-type diffused layer 3 as a receiver formed in the N−-type silicon epitaxial layer 2, an insulating film 104 covering the surfaces of the N−-type silicon epitaxial layer 2 and the P-type diffused layer 3, and an electrode 112 formed on the insulating film 104. The electrode 112 is made up of an Al layer 105, a TiW/Au layer 106, and an AuSn layer 107. The Al layer 105 is in ohmic contact with the P-type diffused layer 3 and an N-type diffused layer (unshown). A TiW layer in the TiW/Au layer 106 functions as a barrier metal, while an Au layer in the TiW/Au layer 106 improves adherence between the TiW layer and the AuSn layer 107. The AuSn layer 107 functions as a solder to adhere to an unshown Au electrode of the red color laser diode 13. The red color laser diode 13 is composed of a P-type layer 8 with a thickness of 5 to 6 µm, and an N-type layer 9 with a thickness of approx. 110 µm, to radiate a laser beam of 654 nm.

For manufacturing the above background art semiconductor device, the red color laser diode 13 is mounted on the electrode 112, and heat of 380 to 400° C. is applied for 12 minutes to weld the AuSn layer 107 and the Au electrode (unshown) of the red color laser diode 13. The red color laser diode 13 is susceptible to heat. Accordingly, if the red color laser diode 13 is used for a long period of time under high temperature conditions, an operating current necessary for obtaining a desired optical output is gradually increased by deterioration of elements. As a result, the red color laser diode 13 gets thermal destruction due to thermorunaway. To prevent such thermal destruction, thickness of the P-type layer 8 is reduced for decreasing thermal resistance.

Figure 14:
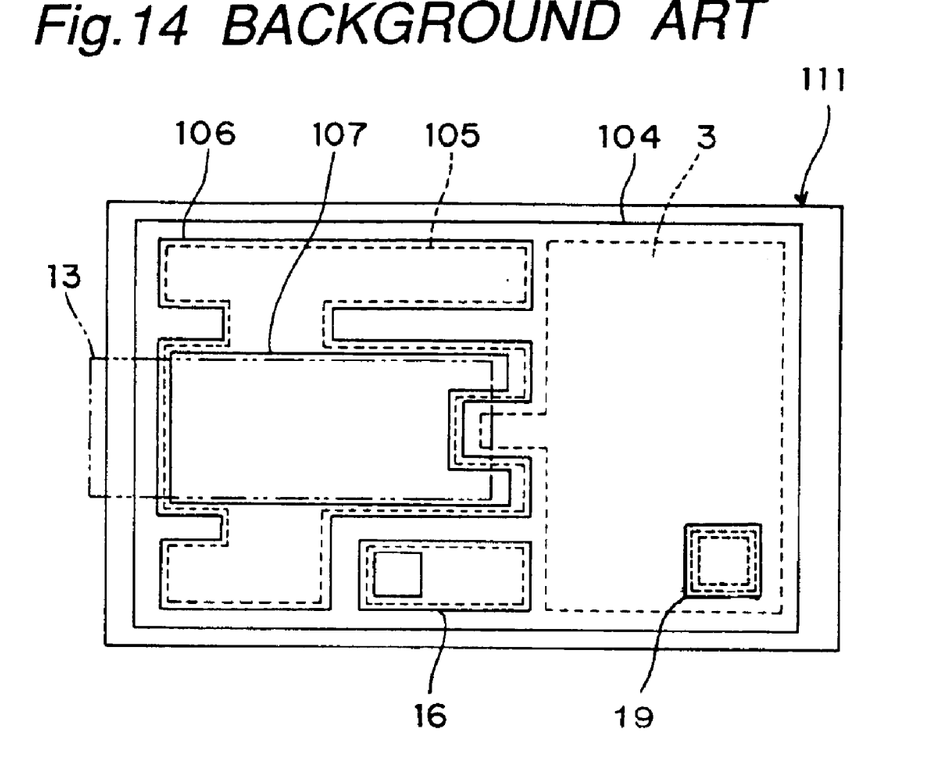
FIG. 14 is a schematic plane view showing the background art semiconductor device for DVD.

FIG. 14 is a plane view showing the above-stated background art semiconductor device from the upper side. It is noted that the red color laser diode 13 is depicted with an alternate long and two short dashes line in FIG. 14.

In the above-structured semiconductor device shown in FIG. 14, the red color laser diode 13 is mounted on the AuSn layer 107. A light beam radiated from the back side of the red color laser diode 13 is received by the P-type diffused layer 3, by which an output of a light beam radiated from the front side of the red color laser diode 13 is monitored. In other words, based on the light beam radiated from the back side of the red color laser diode 13, the optical output from the front side of the red color laser diode 13 is monitored.

Figure 15:
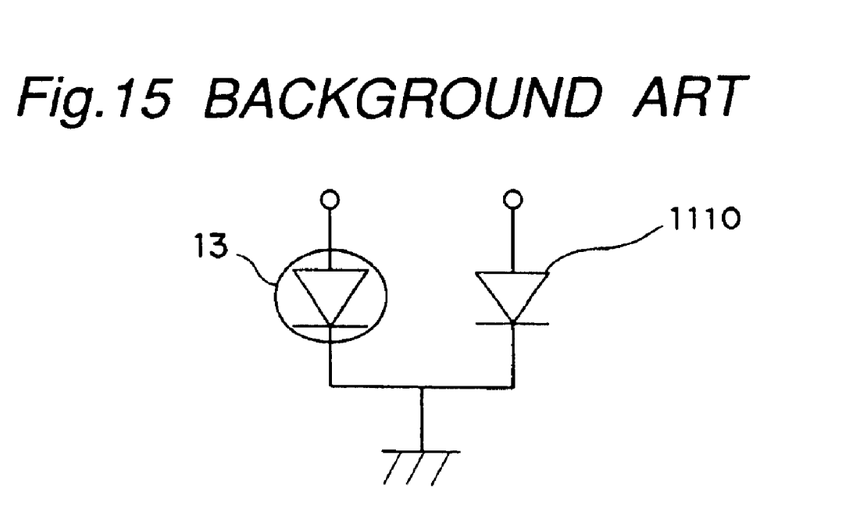
FIG. 15 is a view showing the equivalent circuit of the background art semiconductor device for DVD.

In an equivalent circuit of the semiconductor device shown in FIG. 15, a photodiode 1110 corresponding to the silicon submount photodiode chip 111 is connected to the red color laser diode 13 through a common cathode.

However, since the red color laser diode 13 is different in band-gap structure from an infrared laser diode, using the background art semiconductor device at ambient tempera-

SUMMARY OF THE INVENTION

Accordingly, it is an object of the present invention to provide a semiconductor device and a manufacturing method therefor, which enables prevention of thermal destruction of laser chips.

The above object can be accomplished by reducing the thermal resistance either through increase in the luminous efficiency of the laser chips or through improvement of heat radiation of submount photo diodes. The present invention relates to the latter improvement of heat radiation, where a hole is provided in an insulating film just under an electrode to which a laser chip is die-bonded, for reducing thermal resistance.

In order to achieve the above object, there is provided a semiconductor device, comprising: a photodiode chip provided with an insulating film on a surface thereof; and a laser chip die-bonded onto the photodiode chip, the photodiode chip receiving a light beam radiated from a back side of the laser chip for monitoring an output of a light beam radiated from a front side of the laser chip, wherein the insulating film of the photodiode chip is provided with a hole located beneath an electrode that die-bonds the laser chip onto the photodiode chip.

According to the above-structured semiconductor device, the insulating film of the photodiode chip is provided with a hole located beneath an electrode that die-bonds the laser chip onto the photodiode chip. Consequently, the insulating film is not present under the electrode, so that the thermal resistance is reduced. As a result, if the semiconductor device is used under high temperature conditions, heat of the laser chip is efficiently discharged, and so the thermorunaway of the laser chip can be prevented.

For example, in the case of using $SiO_2$ as the insulating film, the heat conductivity of Si is 1.5W/cm ° C., whereas heat conductivity of the $SiO_2$ is 0.0145W/cm ° C. This indicates that the heat conductivity of $SiO_2$ is two digits smaller than that of Si.

In one embodiment of the present invention, two diffused layers, whose conductive types are different from each other, are formed on an area facing the hole of the insulating film in the photodiode chip, so that an anode of the laser chip and a substrate of the photodiode chip are not short-circuited.

According to the above embodiment, two diffused layers, whose conductive types are different from each other, are formed on an area facing the hole on the insulating film of the photodiode chip, so that an anode of the laser chip and a substrate of the photodiode chip are not short-circuited. This ensures radiation of a leaser beam from the laser chip.

In one embodiment of the present invention, the diffused layer, that is the surface side layer among two diffused layers, has a diffusion depth of 1.5 to 4.0 µm.

According to the above embodiment, in the process of die-bonding the laser chip to the top of the photodiode chip, the melted electrode may be protruded toward the substrate of the photodiode chip. Here, if a diffused layer, that is the surface side layer among the two diffused layers, has a diffusion depth set to 1.5 to 4.0 µm, the melted electrode falls short of the diffused layer, that is the inner side layer among the two diffused layers. This enables prevention of the electrode from being short-circuited with the inner side diffused layer among two diffused layers.

If the surface side diffused layer among the two diffused layer has a diffusion depth of less than 1.5 µm, the melted electrode reaches the inner side diffused layer among two diffused layers. This disables prevention of the electrode from being short-circuited with the inner side diffused layer among two diffused layers.

For providing the surface side diffused layer among the two diffused layers with a diffusion depth of more than 4.0 µm, it is required to set the inner side diffused layer 34 to have a diffusion depth of 5.0 µm or more. This results in prolonged diffusion time of these two diffused layers.

Also, there is provided a semiconductor device, comprising: a photodiode chip provided with an insulating film on a surface thereof; and a laser chip die-bonded onto the photodiode chip, the photodiode chip receiving a light beam radiated from a back side of the laser chip for monitoring an output of a light beam radiated from a front side of the laser chip, wherein the insulating film of the photodiode chip is provided with a hole in an area not facing the laser chip, and with an electrode for closing the hole of the insulating film, two diffused layers, whose conductive types are different from each other, are formed on an area facing the hole of the insulating film in the photodiode chip, so that an anode of the laser chip and a substrate of the photodiode chip are not short-circuited.

According to the above semiconductor device, the insulating film of the photodiode chip is provided with a hole in an area not facing the laser chip, and with an electrode for closing the hole of the insulating film. Accordingly, heat of the laser chip can be conducted to the photodiode chip not via an insulating film with poor heat conductivity, but via an electrode of Au and the like. Therefore, if the semiconductor device is used under high temperature conditions, heat of the laser chip is efficiently discharged, and thermorunaway of the laser chip can be prevented.

According to the above semiconductor device, two diffused layers, whose conductive types are different from each other, are formed on an area facing the hole of the insulating film in the photodiode chip, so that an anode of the laser chip and a substrate of the photodiode chip are not short-circuited. Accordingly, this ensures radiation of a leaser beam from the laser chip.

In one embodiment of the present invention, a portion of the electrode located beneath the laser chip has four-layer structure made up of Al, TiW, Au, and AuSn, whereas a portion of the electrode not beneath the laser chip has three-layer structure made up of Al, TiW, and Au.

According to the above embodiment, the electrode beneath the laser chip has four-layer structure made up of Al, TiW, Au, and AuSn. Consequently, bonding an AuSn layer of the electrode to, for example, an Au electrode of the laser chip implements improved adherence between the electrode and the laser chip.

In one embodiment of the present invention, the TiW has a film thickness of 300 to 750 nm.

By setting the thickness of the TiW film 300 to 750 nm in the above embodiment, the melted AuSn layer can not penetrate through the TiW layer to prevent the AuSn Layer from being in contact with and reacting on the Al layer.

Setting the TiW layer to have a film thickness of 300 nm or less causes the AuSn layer to penetrate through the TiW layer.

Setting the TiW layer to have a film thickness of over 750 nm generates cracks in the TiW layer.

In one embodiment of the present invention, a temperature of laser die-bonding performed for melting the AuSn is 340 to 380° C.

According to the above embodiment, the temperature of laser die-bonding performed for melting the AuSn is 340 to 380° C. Consequently, the electrode can be efficiently melted, implementing increased strength of adhesive bonding of the electrode and the laser chip.

A temperature of the laser die-bonding being less than 340° C. inhibits sufficient melting of the electrode, resulting in decreased strength of adhesive bonding of the electrode and the laser chip.

A temperature of the laser die-bonding being over 380° C. causes the melted electrode to protrude deeper toward the substrate of the photodiode chip.

In one embodiment of the present invention, a portion of the electrode beneath the laser chip has three-layer structure composed of TiW, Au, and AuSn.

According to the above embodiment, the portion of the electrode beneath the laser chip has three-layer structure composed of TiW, Au, and AuSn.

The portion of the electrode beneath the laser chip does not have an Al layer, and therefore contact reaction of the AuSn layer and the Al layer is not generated. In this structure, therefore, the AuSn layer does not reach the inner diffused layer with laser die-bonding performed at a temperature of 420° C.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the semiconductor device and the manufacturing method therefor according to the embodiments of the present invention will be described with reference to the accompanying drawings. Although description will be herein given of the embodiments of a semiconductor device for DVD dedicated for reading of DVD and the like, it will be understood that the present invention is not limited to the embodiments disclosed.

(First Embodiment)

Figure 1:
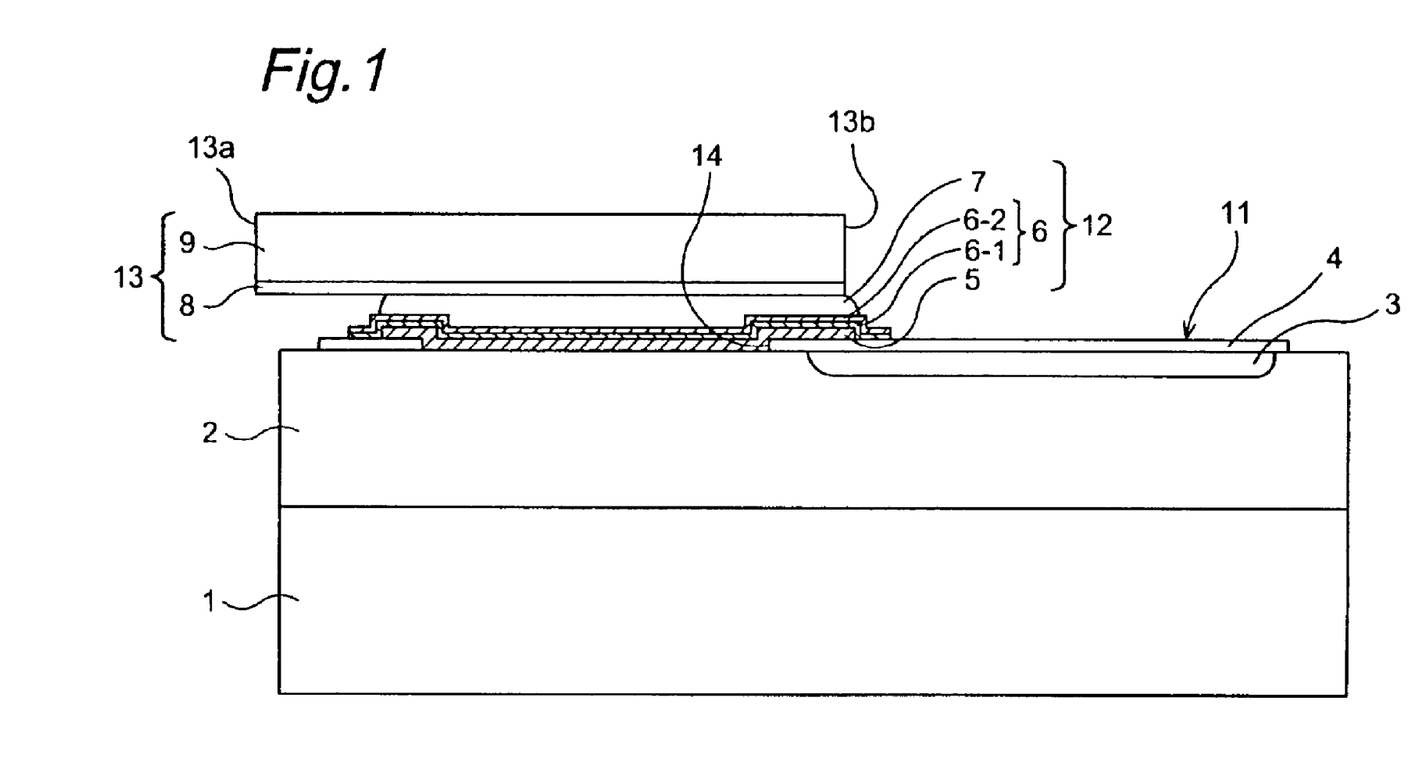
FIG. 1 is a schematic cross sectional view showing the structure of a semiconductor device for DVD according to a first embodiment of the present invention.

FIG. 1 is a schematic cross sectional view showing a semiconductor device for DVD according to a first embodiment of the present invention. It is noted that component members equal to those of a background art example shown in FIG. 13 are designated by equal reference numerals, and description thereof is omitted or simplified.

As shown in FIG. 1, the semiconductor device is composed of a silicon submount photodiode chip 11, and a red color laser diode 13 serving as a laser chip die-bonded onto the top of the silicon submount photodiode chip 11. In the semiconductor device, a light beam radiated from a back side 13b of the red color laser diode 13 is received by a P-type diffused layer 3, by which an output of a light beam radiated from a front side 13a of the red color laser diode 13 is monitored. In other words, based on the light beam radiated from the back side 13b of the red color laser diode 13, the semiconductor device monitors the optical output from the front side 13a of the red color laser diode 13.

The silicon submount photodiode chip 11 includes an N$^+$-type silicon substrate 1, an N$^-$-type silicon epitaxial layer 2 on the N$^+$-type silicon substrate 1, a P-type diffused layer 3 as a receiver formed in the N$^-$-type silicon epitaxial layer 2, an insulating film 4 covering the surfaces of the N$^-$-type silicon epitaxial layer 2 and the P-type diffused layer 3, and an electrode 12 formed on the insulating film 4. A portion of the electrode 12 just beneath the red color laser diode 13 is made up of an Al layer 5, a TiW/Au layer 6, and an AuSn layer 7. Although the TiW/Au layer 6 is shown as if composed of one layer in FIG. 1, the TiW/Au layer 6 is composed of two layers: a TiW layer and an Au layer.

Figure 2:
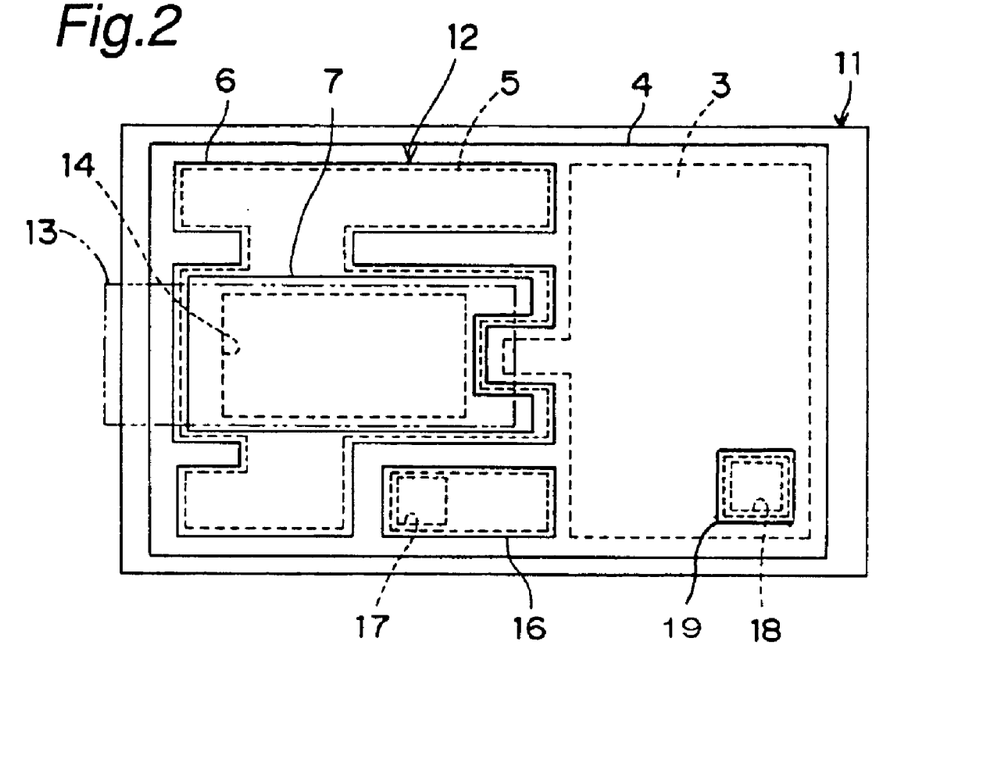
FIG. 2 is a schematic plane view showing the semiconductor device for DVD according to the first embodiment.

FIG. 2 is a schematic plane view showing the semiconductor device from the upper side. It is noted that the red color laser diode 13 is depicted with an alternate long and two short dashes line in FIG. 2.

As shown in FIG. 2, a portion of the electrode 12 not beneath the red color laser diode 13 is composed of the Al layer 5 and the TiW/Au layer 6. In an area of the insulating film 4 right beneath the red color laser diode 13, there is formed a hole 14, which is closed by the Al layer 5 (see FIG. 1). This puts the Al layer 5 in direct contact with the N-type silicon epitaxial layer 2. It is noted that reference numeral 16 denotes a cathode electrode, 19 denotes an anode electrode, and 17 and 18 denote a contact hole.

Figure 3:
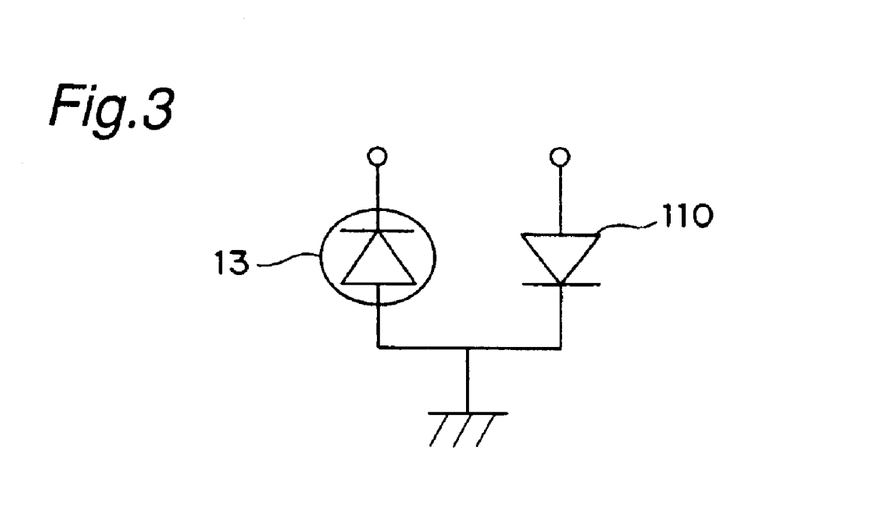
FIG. 3 is a view showing the equivalent circuit of the semiconductor device for DVD according to the first embodiment.

The above-structured semiconductor device has an equivalent circuit shown in FIG. 3. The direction of a photodiode 110 corresponding to the silicon submount photodiode chip 11 is the same as the equivalent circuit of the background art example shown in FIG. 15, though the direction of the red color laser diode 13 is reverse. This indicates that the photodiode 110 and the red color laser diode 13 are not connected through a common cathode.

According to the above-structured semiconductor device, the insulating film 4 is provided with a hole 14 formed right beneath the red color laser diode 13. Consequently, the insulating film 4 is not present right beneath the red color laser diode 13, which reduces the thermal resistance. As a result, if the semiconductor device is used under high temperature conditions, heat of the red color laser diode 13 is efficiently discharged from the hole 14 of the insulating film 4, and so the thermorunaway of the laser chip can be prevented.

Although the N$^+$-type silicon substrate and the N$^-$-type silicon epitaxial layer 2 are used in the semiconductor device of the first embodiment, substrates and epitaxial layers made from materials other than silicon may also be used. Further, a P-type substrate may be substituted for the N-type substrate without departing from the spirit of the present invention.

(Second Embodiment)

Figure 4:
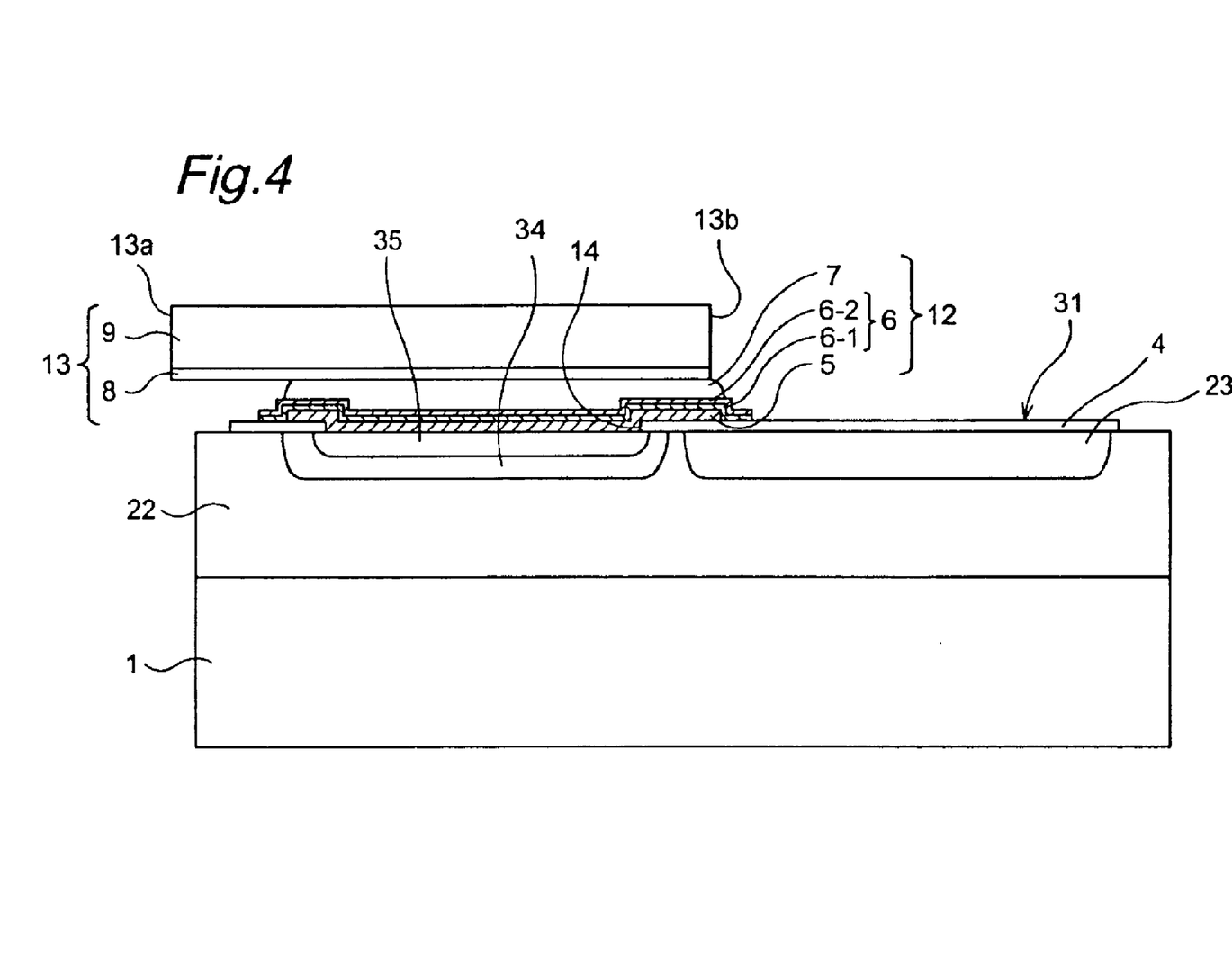
FIG. 4 is a schematic cross sectional view showing the structure of a semiconductor device for DVD according to a second embodiment of the present invention.
Figure 5:
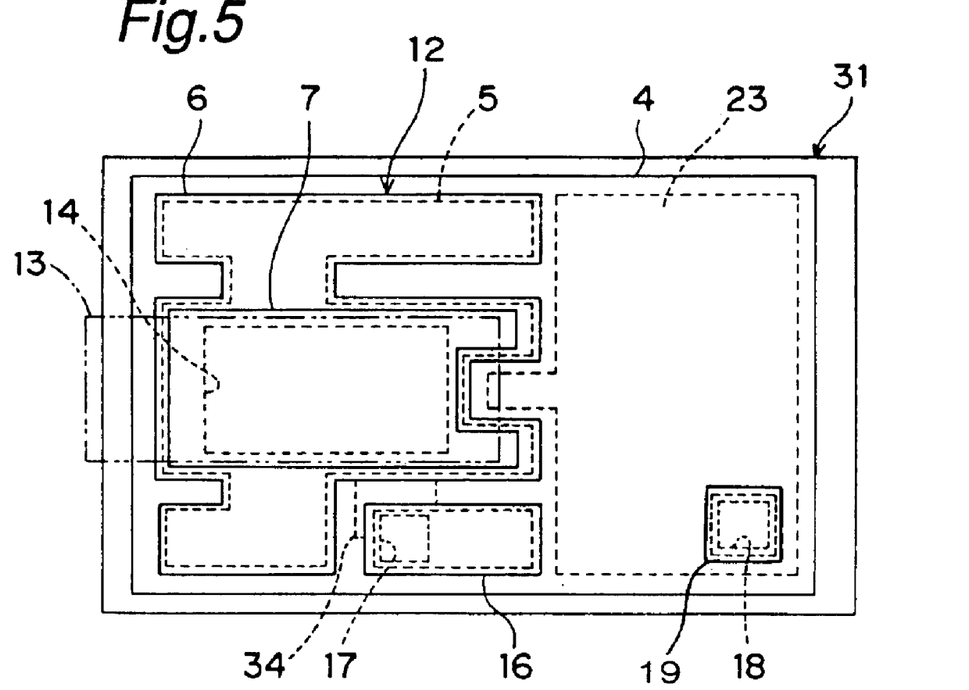
FIG. 5 is a schematic plane view showing the semiconductor device for DVD according to the second embodiment.

FIG. 4 is a schematic cross sectional view showing a semiconductor device for DVD according to a second embodiment of the present invention, and FIG. 5 is a schematic plane view showing the semiconductor device from the upper side. It is noted that component members equal to those of the first embodiment shown in FIG. 1 are designated by equal reference numerals, and description thereof is omitted or simplified.

The semiconductor device is structured as shown in FIG. 4 to have common cathode structure equal to the prior art shown in FIG. 13.

More particularly, the semiconductor device has a silicon submount photodiode chip 31. The silicon submount photodiode chip 31 includes an N$^+$-type silicon substrate 1, an N$^-$-type silicon epitaxial layer 22 on the N$^+$-type silicon substrate 1, a P-type diffused layer 23 as a receiver formed in the N$^-$-type silicon epitaxial layer 22, an insulating film 4 covering the surfaces of the N$^-$type silicon epitaxial layer 22 and the P-type diffused layer 23, and an electrode 12 formed on the insulating film 4. In an area facing a hole 14 of the insulating film 4 in the N$^-$-type silicon epitaxial layer 22, there is formed a double diffusion structure. The double diffusion structure is composed of a P-type diffused layer 34 and an N-type diffused layer 35 formed on the P-type diffused layer 34. The P-type diffused layer 34 is short-circuited to the N$^-$-type silicon epitaxial layer 22 through a cathode electrode 16 as shown in FIG. 5.

Figure 6:
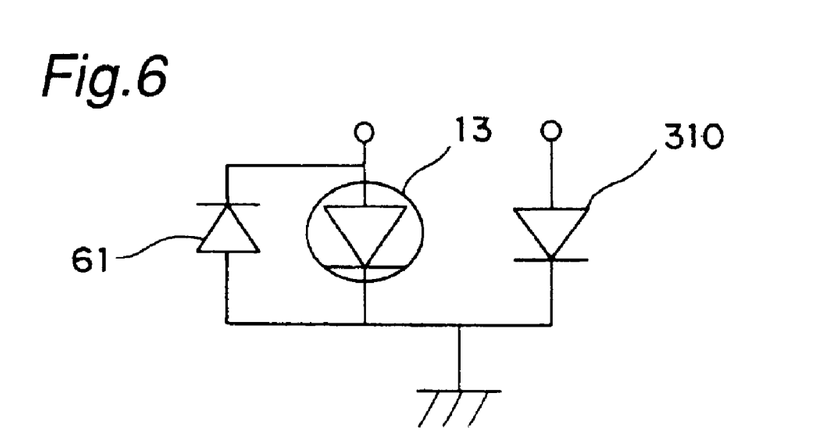
FIG. 6 is a view showing the equivalent circuit of the semiconductor device for DVD according to the second embodiment.

FIG. 6 shows the equivalent circuit of the semiconductor device. As shown in FIG. 6, a photodiode 310 corresponding to the silicon submount photodiode chip 31 is connected to the red color laser diode 13 through a common cathode. Also, the anode of a diode 61, that is the above-stated double diffusion structure made up of the P-type diffused layer 34 and the N-type diffused layer 35, is connected to the cathode of the red color laser diode 13.

Also, the cathode of the diode 61 is connected to the anode of the red color laser diode 13.

According to the above-structured semiconductor device, there is formed a double diffusion structure in an area of the N⁻-type silicon epitaxial layer 22 facing the hole 14 of the insulating film 4,. Consequently, if positive potential is applied to the P-type layer 8 of the red color laser diode 13, the diode 61 composed of the P-type diffused layer 34 and the N-type diffused layer 35 is reverse-biased, and so the red color laser diode 13 is not short-circuited to the N⁻-type silicon epitaxial layer 22. Therefore, in the state that the photodiode 310 and the red color laser diode 13 are connected through a common cathode, lighting of the red color laser diode 13 is ensured.

In the case where the silicon submount photodiode chip 31 and the red color laser diode 13 are bonded with the AuSn layer 7, laser die-bonding is performed to melt the AuSn layer 7. However, under certain conditions, the melted AuSn layer 7 may intrude into the TiW/Au layer 6 serving as a barrier layer, react with the Al layer 5, rapidly penetrate toward the N⁻-type silicon epitaxial layer 22, and finally intrude into the junction of the P-type diffused layer 34 and the N-type diffused layer 35. As a result, short-circuit of the AuSn layer 7 and the P-type diffused layer 34 may occur. For preventing occurrence of such short-circuit, it is preferable to set the film thickness of the TiW layer in the TiW/Au layer 6 as shown in the condition (1) below, to set the diffusion depth of the N-type diffused layer 35 as shown in the condition (2) below, or to set the temperature of laser die-bonding as shown in the condition (3) below. It is more preferable to combine the below-stated conditions (1) to (3).

(1) For preventing short-circuit of the Al layer and the P-type diffused layer 34, it is preferable to set the the TiW layer composing the TiW/Au layer 6 to have a film thickness of 300 to 750 nm.

If the TiW layer is set to have a film thickness of less than 300 nm, the AuSn layer 7 penetrates through the TiW layer, and the so called penetration through the barrier layer occurs.

If the TiW layer is set to have a film thickness of over 750 nm, cracks are generated in the TiW layer.

(2) For preventing short circuit of the Al layer 5 and the P-type diffused layer 34, it is preferable to set the diffusion depth of the N-type diffused layer 35 to 1.5 to 4.0 $\mu$m.

If the N-type diffused layer 35 is set to have a diffusion depth of less than 1.5 $\mu$m, the diffusion depth of the N-type diffused layer 35 becomes smaller than the depth of the protrusion of the AuSn layer 7 reacted with the Al layer 5 (so-called spike depth) in the case where the AuSn layer 7 penetrates through the TiW/Au layer 6 and reacts with the Al layer 5. As a result, the AuSn layer 7 reacted with the Al layer 5 intrudes into the junction of the P-type diffused layer 34 and the N-type diffused layer 35, and short-circuits to the P-type diffused layer 34.

If the N-type diffused layer 35 is set to have a diffusion depth of over 4.0 $\mu$m, it is necessary to set the P-type diffused layer 34 to have a diffusion depth of 5.0 $\mu$m or more, resulting in prolonged diffusion time. In addition, the P-type diffused layer 34 is two to three digits higher in density than the N⁻-type silicon epitaxial layer 22. Accordingly, if the diffusion depth of the P-type diffused layer 34 becomes larger than 5 $\mu$m, electron-hole pairs generated around the surface by a light beam are recombined, which brings about reduced monitor current.

(3) For preventing short circuit of the Al layer 5 and the P-type diffused layer 34, it is preferable to set the temperature of laser die-bonding to 340 to 380° C.

If the temperature of the laser die-bonding is set to less than 340° C., sufficient melting of the AuSn layer 7 is not accomplished, resulting in decreased strength of adhesive bonding of the AuSn layer 7 and the red color laser diode 13.

If the temperature of the laser die-bonding is set to over 380° C., the spike depth of the AuSn layer 7 penetrating through the TiW layer and reacting with the Al becomes larger.

It goes without saying that the semiconductor device in the above-described second embodiment makes it possible to prevent thermal destruction of the red color laser diode 13.

(Third Embodiment)

Figure 7:
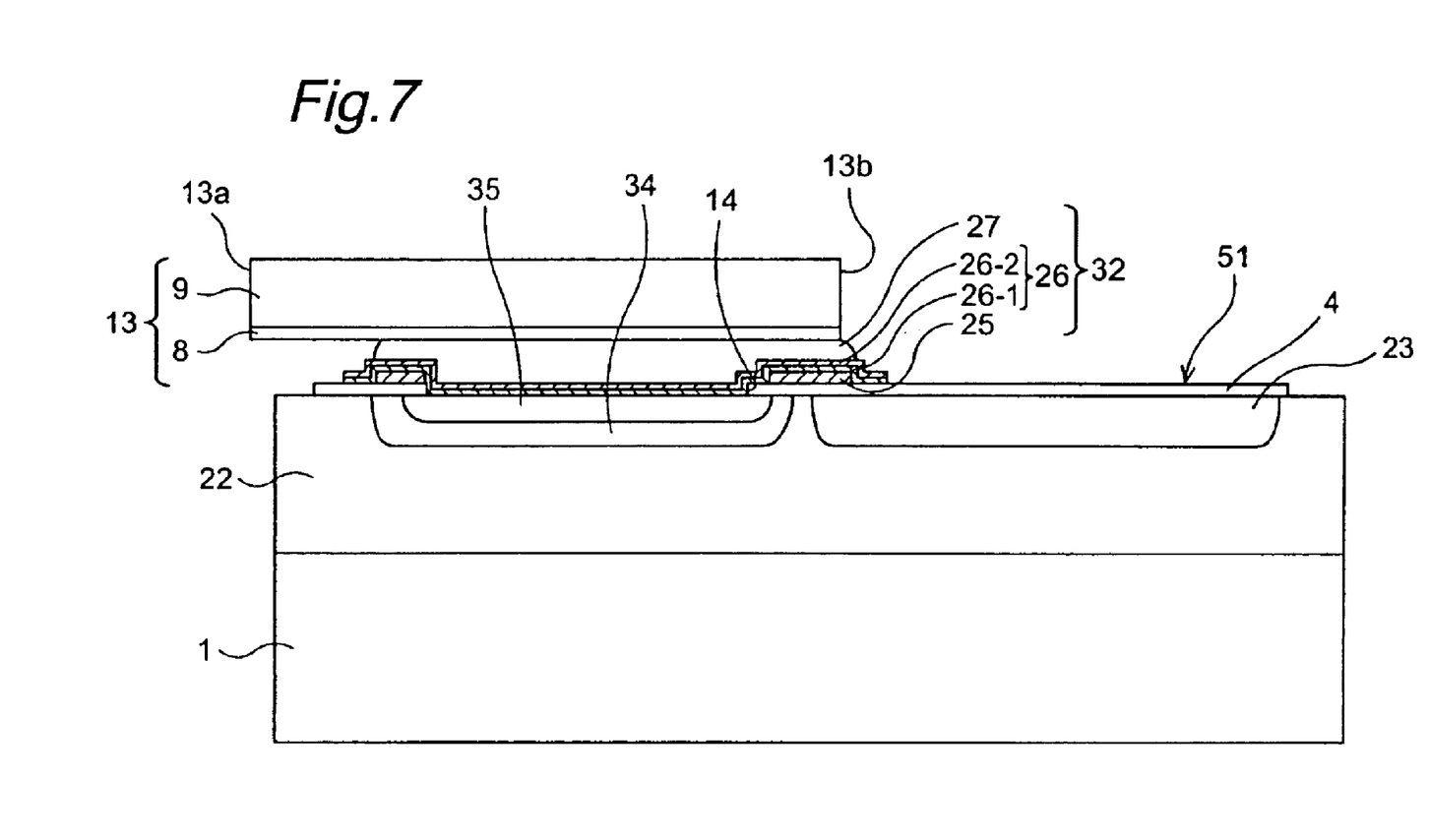
FIG. 7 is a schematic cross sectional view showing the structure of a semiconductor device for DVD according to a third embodiment of the present invention.
Figure 8:
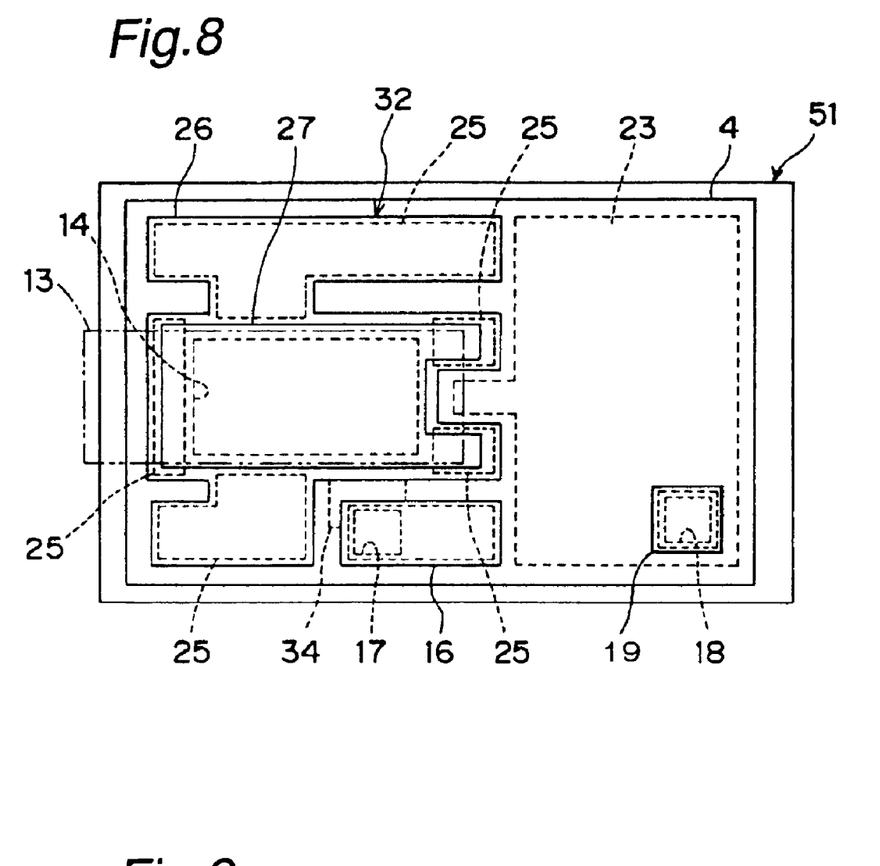
FIG. 8 is a schematic plane view showing the semiconductor device for DVD according to the third embodiment.

FIG. 7 is a schematic cross sectional view showing a semiconductor device for DVD according to a third embodiment of the present invention, and FIG. 8 is a schematic plane view showing the semiconductor device from the upper side. It is noted that component members equal to those of the second embodiment shown in FIG. 4 are designated by equal reference numerals, and description thereof is omitted or simplified.

This semiconductor device is different from the second embodiment in the point that the Al layer in the hole 14 of the insulating film 4 is not present as shown in FIG. 7.

More particularly, a silicon submount photodiode chip 51 incorporated in the semiconductor device includes an N⁺-type silicon substrate 1, an N⁻-type silicon epitaxial layer 22 on the N⁺-type silicon substrate 1, a P-type diffused layer 23 as a receiver formed in the N⁻-type silicon epitaxial layer 22, an insulating film 4 covering the surfaces of the N⁻-type silicon epitaxial layer 22 and the P-type diffused layer 23, and an electrode 32 formed on the insulating film 4. A portion of the electrode 32 just beneath the red color laser diode 13 is made up of a TiW/Au layer 26, and an AuSn layer 27, and the TiW/Au layer 26 closes the hole 14 of the insulating film 4.

As shown in FIG. 8, a portion of the electrode 32 not beneath the red color laser diode 13 is composed of an Al layer 25 and the TiW/Au layer 26. The Al layer 25 is patterned so as not to close the hole 14 of the insulating film 4.

Figure 9:
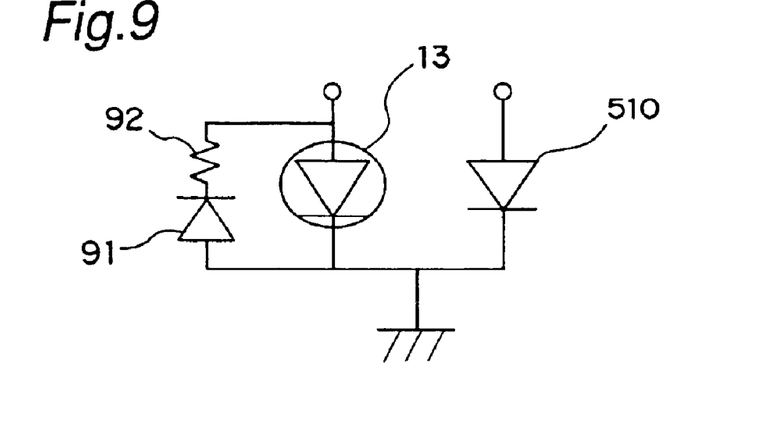
FIG. 9 is a view showing the equivalent circuit of the semiconductor device for DVD according to the third embodiment.

The above-structured semiconductor device has an equivalent circuit shown in FIG. 9. As shown in FIG. 9, a photodiode 510 corresponding to the silicon submount photodiode chip 51 is connected to the red color laser diode 13 through a common cathode. Also, a diode 91 having the double diffusion structure is grounded, and the anode of the diode 91 and the cathode of the red color laser diode 13 are set to be at the same potential. It is noted that reference numeral 92 denotes resistance, which is a pseudo contact resistance of the TiW/Au layer 26 and the N-type diffused layer 35.

According to the above-structured semiconductor device, even if laser die-bonding causes the AuSn layer 27 to penetrate through the TiW/Au layer 26, it is possible to prevent the AuSn layer 27 from reacting with the Al. Because of the absence of reaction of the AuSn layer 27 with the Al, the spike depth of the AuSn layer 27 does not reach the depth of the junction of the P-type diffused layer 34 and the N-type diffused layer 35 even with laser die-bonding performed at a temperature of 400 to 420° C. In other words, the AuSn layer 27 does not penetrate through the junction of the P-type diffused layer 34 and the N-type diffused layer 35.

The TiW/Au layer 26 is not in perfect ohmic contact with the N-type diffused layer 35, and therefore the semiconductor device assumes an equivalent circuit shown in FIG. 9. However, the diode 91 is used only at reverse bias, which eliminates the problem of imperfect ohmic contact.

It goes without saying that the semiconductor device in the above-described third embodiment makes it possible to prevent thermal destruction of the red color laser diode 13.

(Fourth Embodiment)

Figure 10:
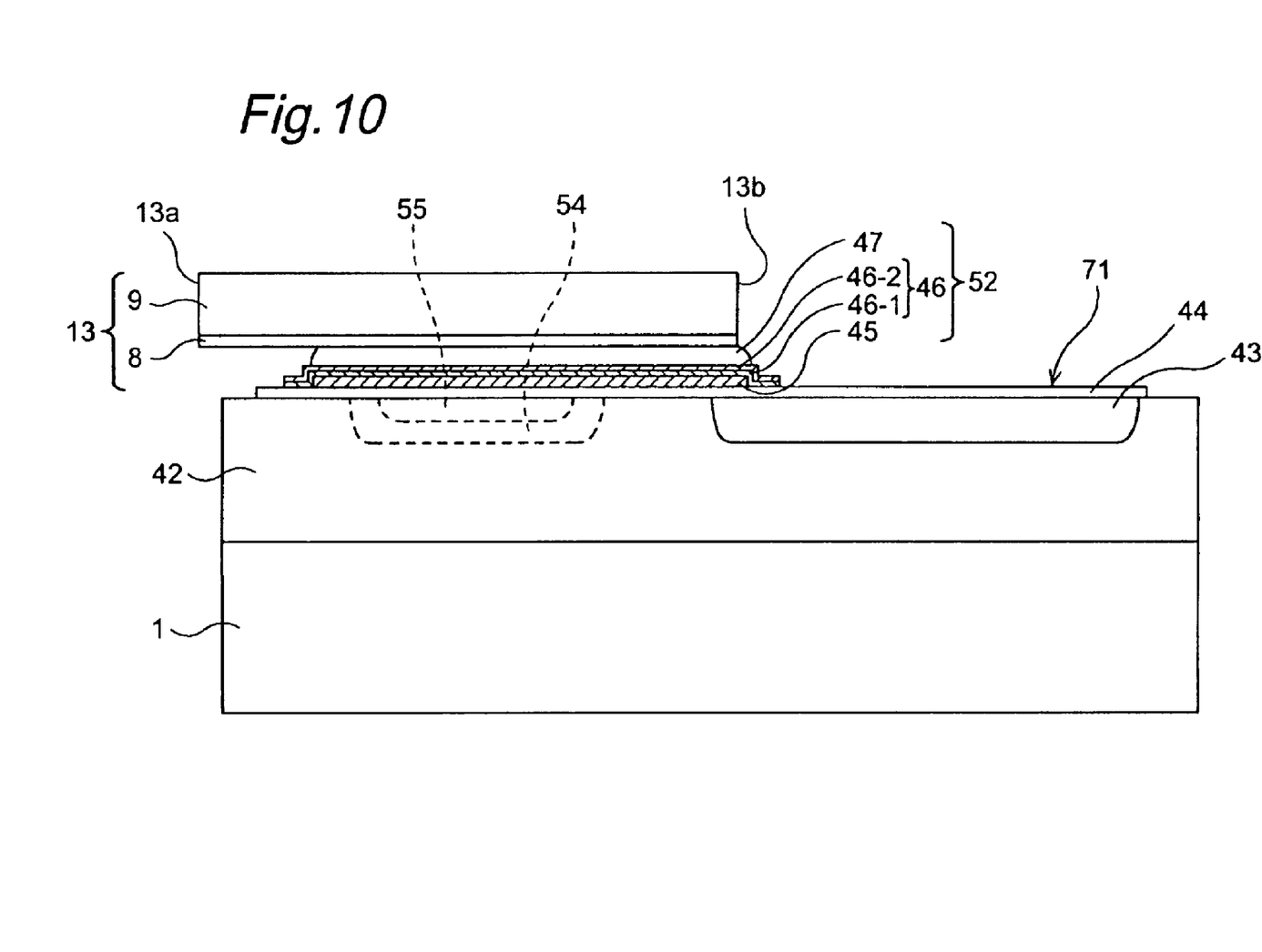
FIG. 10 is a schematic cross sectional view showing the structure of a semiconductor device for DVD according to a fourth embodiment of the present invention.
Figure 11:
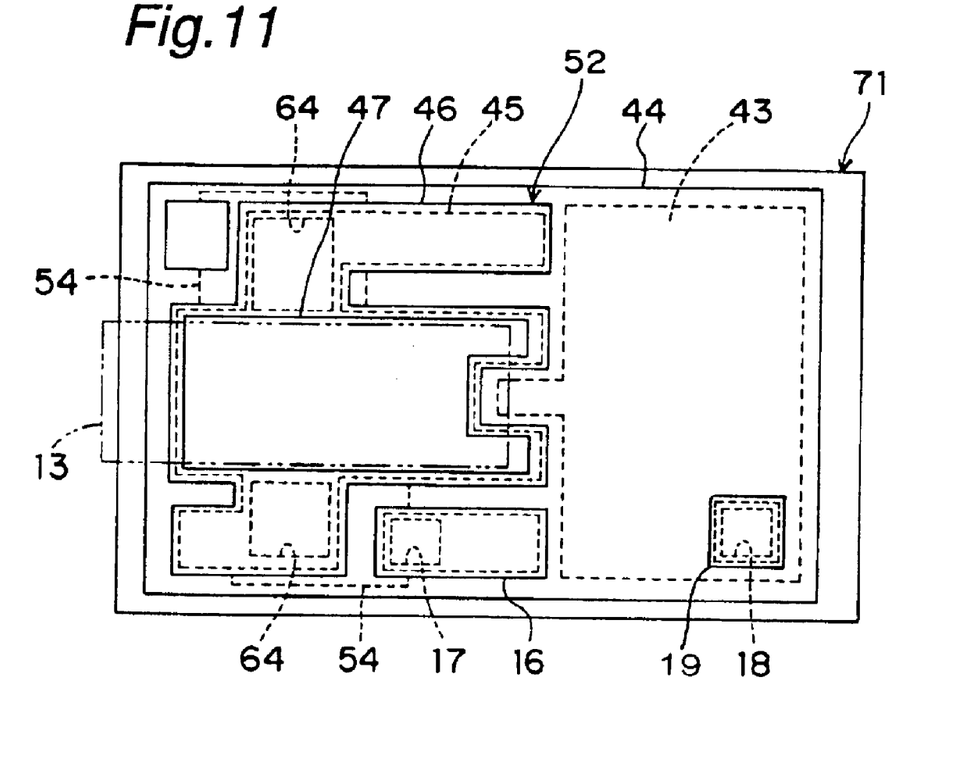
FIG. 11 is a schematic plane view showing the semiconductor device for DVD according to the fourth embodiment.

FIG. 10 is a schematic cross sectional view showing a semiconductor device for DVD according to a fourth embodiment of the present invention, and FIG. 11 is a schematic plane view showing the semiconductor device from the upper side. It is noted that component members equal to those of the third embodiment shown in FIG. 7 are designated by equal reference numerals, and description thereof is omitted or simplified.

As shown in FIG. 10, the semiconductor device is provided with a silicon submount photodiode chip 71 composed of an N+-type silicon substrate 1, an N−-type silicon epitaxial layer 42, an insulating film 44, and an electrode 52. In the N−-type silicon epitaxial layer 42, there are formed a P-type diffused layer 43 as a receiver, and a double diffusion structure. The double diffusion structure is made up of a P-type diffused layer 54 and an N-type diffused layer 55 formed on the P-type diffused layer 54. The double diffusion layer is formed in an area of the N−-type silicon epitaxial layer 42 not right beneath the red color laser diode 13. More particularly, the double diffusion structure of the N−-type silicon epitaxial layer 42 is not formed right beneath the red color laser diode 13. A portion of the electrode 52 right beneath the red color laser diode 13 is made up of an Al layer 45, a TiW/Au layer 46, and an AuSn layer 47.

As shown in FIG. 11, the insulating film 44 of the silicon submount photodiode chip 71 is provided with the hole 64 in an area not facing the red color laser diode 13. The hole 64 of the insulating film 44 faces the double diffusion structure. A portion of the electrode 52 not right beneath the red color laser diode 13 is made up of the Al layer 45 and the TiW/Au layer 46, and the hole 64 of the insulating film 44 is closed by the Al layer 45 of the electrode 52. This means that the hole 64 of the insulating film 44 is formed so as not to overlap with the AuSn layer 47, and is located not right beneath the red color laser diode 13.

Figure 12:
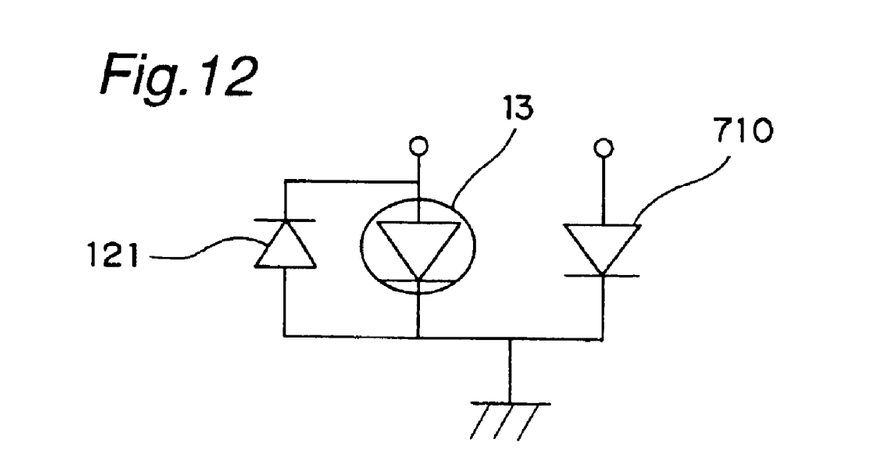
FIG. 12 is a view showing the equivalent circuit of the semiconductor device for DVD according to the fourth embodiment.

The above-structured semiconductor device has an equivalent circuit shown in FIG. 12. As shown in FIG. 12, a photodiode 710 corresponding to the silicon submount photodiode chip 71 is connected to the red color laser diode 13 through a common cathode. Also, a diode 121 having the double diffusion structure is grounded, and the anode of the diode 121 and the cathode of the red color laser diode 13 are set to be at the same potential.

According to the above-structured semiconductor device, if the AuSn layer 47 penetrates through the TiW layer of the TiW/Au layer 46 and reacts with the Al layer 45, the absence of the hole 64 and the double diffusion structure right beneath the AuSn layer 47 prevents short circuit of the AuSn layer 47 and the P-type diffused layer 54.

In addition, the AuSn layer 47 is not imparted to an area of the hole 64 on the insulating film 44 closed by the electrode 52. Therefore, the area does not cause short circuit of the AuSn layer 47 and the P-type diffused layer 54.

It goes without saying that the semiconductor device in the above-described fourth embodiment makes it possible to prevent thermal destruction of the red color laser diode 13.

As is clear from the above description, in the semiconductor device of the present invention, the insulating film is provided with a hole formed right beneath the laser chip. Therefore, the heat resistance is reduced by 30 to 50% compared to the background art example shown in FIG. 13, enabling prevention of thermorunaway of the laser chip.

In addition, using the semiconductor device in a pickup for DVD makes it possible to provide a pickup for DVD operable under high temperature conditions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a photodiode chip provided with an insulating film on a surface thereof;
   a laser chip die-bonded onto the photodiode chip, the photodiode chip receiving a light beam radiated from a back side of the laser chip for monitoring an output of a light beam radiated from a front side of the laser chip;
   wherein the insulating film of the photodiode chip is provided with a hole located beneath an electrode that die-bonds the laser chip onto the photodiode chip;
   two diffused layers, whose conductive types are different from each other, are formed on an area facing the hole of the insulating film in the photodiode chip, so that an anode of the laser chip and a substrate of the photodiode chip are not short-circuited;
   wherein the diffused layer, that is the surface side layer among two diffused layers, has a diffusion depth of 1.5 to 4.0 µm.

2. A semiconductor device, comprising:
   a photodiode chip provided with an insulating film on a surface thereof; and
   a laser chip die-bonded onto the photodiode chip, the photodiode chip receiving a light beam radiated from a back side of the laser chip for monitoring an output of a light beam radiated from a front side of the laser chip, wherein
   the insulating film of the photodiode chip is provided with a hole in an area not facing the laser chip;
   an electrode which die-bonds the laser chip onto the photodiode chip and which enters the hole of the insulating film;
   two diffused layers, whose conductive types are different from each other, are formed on an area facing the hole of the insulating film in the photodiode chip, so that an anode of the laser chip and a substrate of the photodiode chip are not short-circuited.

3. A semiconductor comprising:
   a photodiode chip provided with an insulating film on a surface thereof;
   a laser chip die-bonded onto the photodiode chip, the photodiode chip receiving a light beam radiated from a back side of the laser chip for monitoring an output of a light beam radiated from a front side of the laser chip;
   wherein the insulating film of the photodiode chip is provided with a hole located beneath an electrode that die-bonds the laser chip onto the photodiode chip;
   wherein a portion of the electrode located beneath the laser chip has four-layer structure made up of Al, TiW, Au, and AuSn, whereas a portion of the electrode not beneath the laser chip has three-layer structure made up of Al, TiW, and Au; and
   wherein the TiW has a film thickness of 300 to 750 nm.

4. A semiconductor device, comprising: a photodiode chip provided with an insulating film on a surface thereof; and a laser chip die-bonded onto the photodiode chip, the photodiode chip receiving a light beam radiated from a back side of the laser chip for monitoring an output of a light beam radiated from a front side of the laser chip, wherein the insulating film of the photodiode chip is provided with a hole located beneath an electrode that die-bonds the laser chip onto the photodiode chip, wherein a portion of the electrode beneath the laser chip has a three-layer structure comprised of TiW, Au, and AuSn with no aluminum patterned to close the hole of the insulating film.

5. The semiconductor device as defined in claim 4, wherein the photodiode comprises two diffused layers, and wherein composition of the transistor avoids the AuSn layer from penetrating through a junction of two diffused layers.

6. The semiconductor device as defined in claim 4, wherein a portion of the electrode not beneath the laser chip has a three-layer structure composed of Al, TiW, and Au.

7. The semiconductor device as defined in claim 6, where a portion of the electrode beneath the laser chip and within the hole has a three-layer structure composed of TiW, Au, and AuSn, and a portion of the electrode beneath the laser chip and outside the hole partially has a four-layer structure composed of Al, TiW, Au, and AuSn.

8. The semiconductor device as defined in claim 4, where a portion of the electrode beneath the laser chip and within the hole has a three-layer structure composed of TiW, Au, and AuSn, and a portion of the electrode beneath the laser chip and outside the hole partially has a four-layer structure composed of Al, TiW, Au, and AuSn.

9. A method of manufacturing a semiconductor device comprising a photodiode chip provided with an insulating film on a surface thereof;

a laser chip die-bonded onto the photodiode chip, the photodiode chip receiving a light beam radiated from a back side of the laser chip for monitoring an output of a light beam radiated from a front side of the laser chip;

wherein the insulating film of the photodiode chip is provided with a hole located beneath an electrode that die-bonds the laser chip onto the photodiode chip;

wherein a portion of the electrode located beneath the laser chip has four-layer structure made up of Al, TiW, Au, and AuSn, whereas a portion of the electrode not beneath the laser chip has three-layer structure made up of Al, TiW, and Au;

wherein the method comprises:

performing laser die-bonding for melting the AuSn at a temperature in a range from 340 to 380° C.

10. A semiconductor device comprising:

a photodiode chip provided with an insulating film on a surface thereof;

a laser chip die-bonded onto the photodiode chip, the photodiode chip receiving a light beam radiated from a back side of the laser chip for monitoring an output of a light beam radiated from a front side of the laser chip;

an electrode that die-bonds the laser chip onto the photodiode chip;

wherein the insulating film of the photodiode chip is provided with a hole located beneath the electrode that die-bonds the laser chip onto the photodiode chip whereby the electrode enters the hole of the insulating film; and wherein the hole is situated not to be overlapped by the laser chip.

11. The semiconductor device as defined in claim 10, further comprising two diffused layers, whose conductive types are different from each other, which are formed on an area facing the hole of the insulating film in the photodiode chip.

12. The semiconductor device of claim 10, wherein the electrode comprises an AuSn layer and an Al layer, and wherein the AuSn layer does not overlap the hole so that short circuiting of the AuSn layer with the photodiode chip is precluded.

* * * * *